(12) United States Patent
Suzuki

(10) Patent No.: US 10,573,372 B2
(45) Date of Patent: Feb. 25, 2020

(54) SENSING OPERATIONS IN MEMORY BY COMPARING INPUTS IN A SENSE AMPLIFIER

(71) Applicant: Micron Technology, Inc., Boise, ID (US)

(72) Inventor: Takamasa Suzuki, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/994,307

(22) Filed: May 31, 2018

(65) Prior Publication Data

US 2019/0371389 A1   Dec. 5, 2019

(51) Int. Cl.
| | |
|---|---|
| G11C 11/4091 | (2006.01) |
| G11C 11/4099 | (2006.01) |
| G11C 11/4096 | (2006.01) |
| G11C 11/408  | (2006.01) |

(52) U.S. Cl.
CPC ...... *G11C 11/4091* (2013.01); *G11C 11/4087* (2013.01); *G11C 11/4096* (2013.01); *G11C 11/4099* (2013.01)

(58) Field of Classification Search
CPC ............ G11C 11/4091; G11C 11/4087; G11C 11/4099; G11C 11/4096
See application file for complete search history.

(56) References Cited

U.S. PATENT DOCUMENTS

| | | | |
|---|---|---|---|
| 2005/0286325 A1 | 12/2005 | Keeth | |
| 2006/0023532 A1 | 2/2006  | Hush et al. | |
| 2009/0103349 A1* | 4/2009 | Hoya | G11C 11/22 365/145 |
| 2011/0058403 A1* | 3/2011 | Hashimoto | G11C 11/22 365/145 |
| 2017/0243622 A1 | 8/2017  | Sandhu et al. | |
| 2017/0309314 A1 | 10/2017 | Zawodny et al. | |
| 2018/0053536 A1 | 2/2018  | Weier | |

OTHER PUBLICATIONS

Jeong et al., "A 0.24-μm 2.0-V 1T1MTJ 16-kb Nonvolatile Magnetoresistance RAM with Self-Reference Sensing Scheme", IEEE Journal of Solid-State Circuits, vol. 38, No. 11, Nov. 2003, pp. 1906-1910.
International Search Report and Written Opinion from related International Patent Application No. PCT/US2019/024728, dated Aug. 8, 2019, 14 pages.

* cited by examiner

*Primary Examiner* — David Lam
(74) *Attorney, Agent, or Firm* — Brooks, Cameron & Huebsch, PLLC

(57) ABSTRACT

The present disclosure includes apparatuses and methods related to sensing operations in memory. An example apparatus can include an array of memory cells; and a controller coupled to the array configured to sense a first memory cell based upon a first input associated with the memory cell and a second input and a third input associated with a second memory cell.

19 Claims, 6 Drawing Sheets

SENSING OPERATIONS IN MEMORY BY COMPARING INPUTS IN A SENSE AMPLIFIER

TECHNICAL FIELD

The present disclosure relates generally to memory devices, and more particularly, to apparatuses and methods for sensing operations in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), ferroelectric random access memory (FeRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory system used in computing devices. Memory systems can include volatile, such as DRAM, for example, and/or non-volatile memory, such as Flash memory, FeRAM, or RRAM, for example.

DETAILED DESCRIPTION

Figure 1:
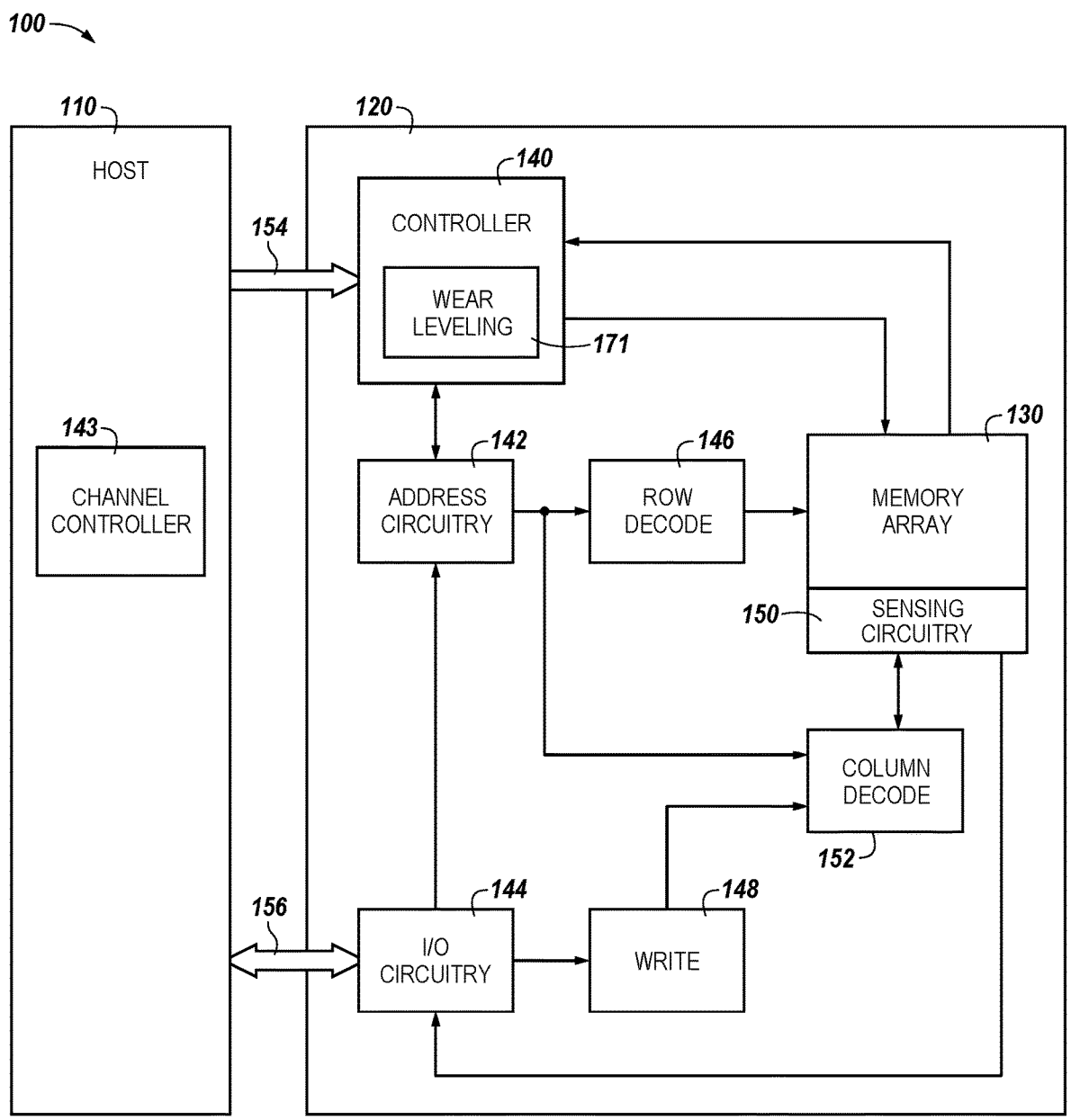
FIG. 1 is a block diagram of an apparatus in the form of a computing system including a memory device in accordance with a number of embodiments of the present disclosure.

The present disclosure includes apparatuses and methods related to sensing operations in memory. An example apparatus can include an array of memory cells and a controller coupled to the array configured to sense a first memory cell based upon a first input associated with the memory cell and a second input and a third input associated with a second memory cell.

In one or more embodiments of the present disclosure, a memory cell can be sensed by applying a signal corresponding to a voltage potential of the memory cell and signals corresponding to complementary voltage potentials of another memory cell to sensing circuitry associated with the memory cell. The another memory cell can be a memory cell that is programmed using two complementary voltage potentials that are stored in different storage elements, such as capacitors of the memory cell (e.g., a two access device/two storage element memory cell such as a two transistor two capacitor (2T2C) memory cell). The sensing circuitry is configured to average the two complementary voltage potentials and compare that average to the voltage potential of the memory cell that is being sensed. The average of the voltage potentials can be the reference voltage for sensing memory cells.

In one or more embodiments of the present disclosure, a first memory cell can be sensed by applying, to sensing circuitry associated with the first memory cell, a signal corresponding to a voltage potential of the first memory cell, a second signal corresponding to a voltage potential of the second memory cell, and a third signal corresponding to a voltage potential of the third memory cell. The second and third voltage potentials are complementary where one of the voltage potentials corresponds to a first data state and the other voltage potential corresponds to a second data state (e.g., two 1T1C memory cells that are operated to obtain one bit of data). The sensing circuitry is configured to average the second and third voltage potentials and compare that average to the voltage potential of the first memory cell that is being sensed. The average of the second and third voltage potentials can be a reference voltage for sensing the first memory cell.

The memory cells that store the voltage potentials that are averaged and used by the sensing circuitry as a reference voltage to sense a particular memory cell can be located within a particular distance of the particular memory cell. For example, the memory cells that store the voltage potentials used as a reference voltage by the sensing circuitry can be coupled to sensing circuitry associated with a group of memory cells, where the group of memory cells include a number of adjacent memory cells. The group of memory cells can include 2, 4, 8, 16, . . . , etc. memory cells that use voltage potentials, as a reference voltage, from a memory cell (or memory cells) that is adjacent to the group of memory cells.

Sensing memory cells in a group of memory cells using a reference voltage from a memory cell (or memory cells) that is adjacent to the group of memory cells can reduce the effects of temperature and/or memory cell structure variations during sensing operation. Also, sensing memory cells in a group of memory cells using a reference voltage from a memory cell (or memory cells) that is adjacent to the group of memory cells can reduce the time of a sensing operation. For example, a sensing operation can be completed before saturation of the voltage potential associated with a memory cell that is being sensed because changes in magnitude of the reference voltage is proportional to changes in magnitude of the voltage potential associated with the memory cell that is being sensed during a sensing operation. Therefore, the voltage potential of the memory cell that is being sensed can be compared to the reference voltage prior to saturation of the voltage potential associated with the memory cell that is being sensed.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 120 which includes a memory array 130 in accordance with a number of embodiments of the present disclosure. As used herein, a memory device 120, controller 140, memory array 130, sensing circuitry 150, and/or wear leveling 171, among other components might also be separately considered an "apparatus."

System 100 in FIG. 1 includes a host 110 coupled (e.g., connected) to the memory device 120. Host 110 may be a host system such as a personal laptop computer, a desktop computer, a digital camera, a smart phone, or a memory card reader, among various other types of hosts. Host 110 may include a system motherboard and/or backplane and may include a number of processing resources (e.g., one or more processors, microprocessors, or some other type of controlling circuitry). The system 100 may include separate integrated circuits or both the host 110 and the memory device 120 may be on the same integrated circuit. The system 100 may be, for instance, a server system and/or a high performance computing (HPC) system and/or a portion thereof. Although the examples shown in FIG. 1 illustrates a system having a Von Neumann architecture, embodiments of the present disclosure may be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 may be a 2D array, a 3D array, a FeRAM, a NAND flash array, and/or NOR flash array, among other types of non-volatile memory arrays. The array 130 may include memory cells arranged in rows coupled by access lines (which may be referred to herein as word lines or select lines) and columns coupled by sense lines (which may be referred to herein as data lines or digit lines). Although a single array 130 is shown in FIG. 1, embodiments are not so limited. For instance, memory device 120 may include a number of arrays 130 (e.g., a number of banks of NAND flash cells, etc.).

The memory device 120 may include address circuitry 142 to latch address signals provided over a data bus 156 (e.g., an I/O bus connected to the host 110) by I/O circuitry 144 (e.g., provided to external ALU circuitry via local I/O lines and global I/O lines). As used herein, external ALU circuitry may enable input of data to and/or output of data from a bank (e.g., from and/or to the controller 140 and/or host 110) via a bus (e.g., data bus 156).

The channel controller 143 may include a logic component to allocate a plurality of locations (e.g., controllers for subarrays) in the arrays of each respective bank to store bank commands, application instructions (e.g., for sequences of operations), and arguments (PIM commands) for various banks associated with operations for each of a plurality of memory devices 120. The channel controller 143 may dispatch commands (e.g., PIM commands) to the plurality of memory devices 120 to store those program instructions within a given bank (e.g. bank 221 in FIG. 2) of a memory device 120. In some embodiments, the channel controller 143 can be located in the host 110.

Address signals are received through address circuitry 142 and decoded by a row decoder 146 and a column decoder 152 to access the memory array 130. Data may be sensed (read) from memory array 130 by sensing voltage and/or current changes on sense lines (digit lines) using a number of sense amplifiers, as described herein, of the sensing circuitry 150. A sense amplifier may read and latch a page (e.g., a row) of data from the memory array 130. Additional compute circuitry, as described herein, may be coupled to the sensing circuitry 150 and may be used in combination with the sense amplifiers to sense, store (e.g., cache and/or buffer), perform compute functions (e.g., operations), and/or move data. The I/O circuitry 144 may be used for bi-directional data communication with host 110 over the data bus 156 (e.g., a 64 bit wide data bus). The write circuitry 148 may be used to write data to the memory array 130.

Controller 140 may decode signals (e.g., commands) provided by control bus 154 from the host 110. These signals may include chip enable signals, write enable signals, and/or address latch signals that may be used to control operations performed on the memory array 130, including data sense, data store, data movement (e.g., copying, transferring, and/or transporting data values), data write, and/or data erase operations, among other operations. In various embodiments, the controller 140 may be responsible for executing instructions from the host 110 and/or accessing the memory array 130. The controller 140 may be a state machine, a sequencer, or some other type of controller. The controller 140 may control sensing data (e.g., reading data) in a row of an array (e.g., memory array 130) and execute microcode instructions to perform operations such as compute operations (e.g., AND, OR, NOR, XOR, add, subtract, multiply, divide, etc.). The controller 140 may include wear leveling logic 171. The controller 140 may communicate with the wear leveling logic 171 to move data as a wear leveling operation between rows and/or between sections to prevent data loss.

Examples of the sensing circuitry 150 are described further below (e.g., in FIGS. 2, 3, 4, 5, and 6). For instance, in some embodiments, the sensing circuitry 150 may include a number of sense amplifiers. In some embodiments, the sensing circuitry 150 may include the number of sense amplifiers and a corresponding number of compute components, which may serve as an accumulator and may be used to perform operations in each subarray (e.g., on data associated with complementary sense lines) in addition to the in data path compute operations described herein.

In some embodiments, the sensing circuitry 150 may be used to perform operations using data stored by memory array 130 as inputs and participate in movement of the data for copy, transfer, transport, writing, logic, and/or storage operations to a different location in the memory array 130 and/or in logic stripes.

Figure 2:
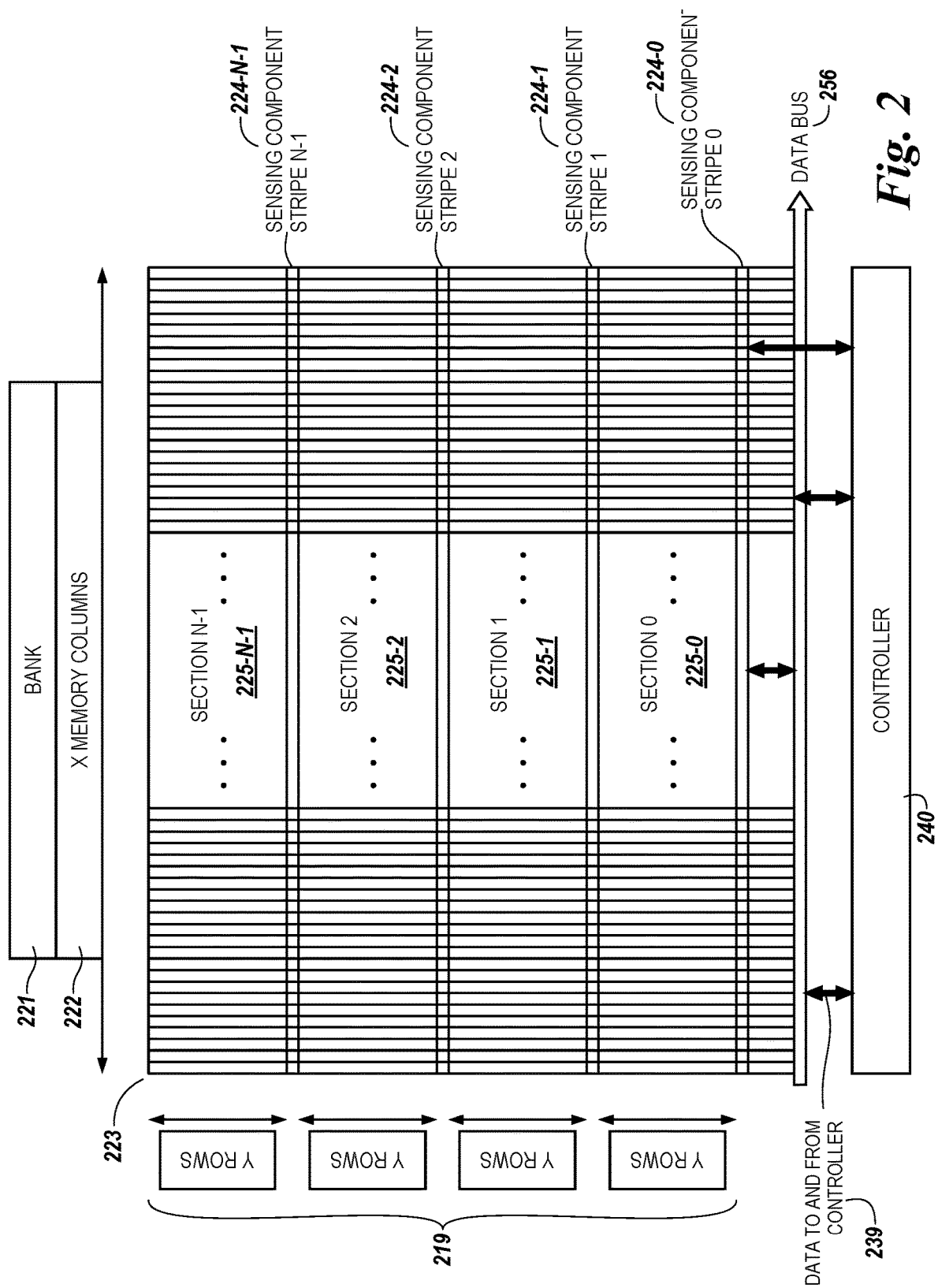
FIG. 2 is a block diagram of a plurality of sections of a bank of a memory device in a computing system in accordance with a number of embodiments of the present disclosure.

FIG. 2 is a block diagram of a plurality of sections, e.g., sections 225-0, 225-1, . . . , 225-N-1, of a bank 221 of a memory device (e.g. memory device 120 in FIG. 1) in a computing system (e.g. computing system 100 in FIG. 1) in accordance with a number of embodiments of the present disclosure. By way of illustration, FIG. 2 shows a bank section 223 of the bank 221 of the memory device. For example, bank section 223 can represent an example bank section of a number of bank sections of the bank 221 of the memory device, e.g., bank section 0, bank section 1, . . . , bank section M-1 (not shown). As shown in FIG. 2, a bank section 223 can include a plurality of memory columns 222 shown horizontally as X, e.g., 4096, 8192, or 16,384 columns, among various possibilities, in an example bank section. Additionally, the bank section 223 may be divided into section 0, section 1, . . . , and section N-1, e.g., 32, 64, or 128 sections, among various possibilities, shown at 225-0, 125-1, . . . , 225-N-1, respectively, that are separated by amplification regions configured to be coupled to a data path. As such, the sections 225-0, 225-1, . . . , 225-N-1 can each have amplification regions 224-0, 224-1, . . . 224-N-1 that correspond to sensing component stripe 0, sensing component stripe 1, . . . , and sensing component stripe N-1, respectively.

Each column 222, e.g., single or each pair of sense or digit lines, is configured to be coupled to sensing circuitry (e.g. sensing circuitry 150 in FIG. 1). As such, each column 222 in a section 225 can be coupled individually to a sense amplifier that contributes to a sensing component stripe 224 for that section. For example, as shown in FIG. 2, the bank section 223 can include sensing component stripe 0, sensing component stripe 1, . . . , sensing component stripe N-1 that each have sensing circuitry with sense amplifiers that can, in various embodiments, be used as registers, cache and/or data buffering and that are coupled to each column 222 in the sections 225-0, 225-1, . . . , 225-N-1.

Each of the sections 225-0, 225-1, . . . , 225-N-1 can include a plurality of rows 219 shown vertically as Y, e.g., each section may include 256, 512, 1024 rows, among various possibilities, in an example bank. Embodiments are not limited to the example horizontal and vertical orientation of columns and rows described herein or the example numbers thereof. Each of the plurality of rows 219 can include a single memory cell selectably coupled to each sense line. Each of the complementary memory cells of the pair can be coupled to one of a respective pair of sense lines at a position of the sense lines on the row. As such, the number of memory cells in a row can correspond to the number of sense lines that intersect that row.

As shown in FIG. 2, portions of the sensing circuitry, e.g., sense amplifiers, compute components, etc., can be separated between a number of sensing component stripes 224 that are each physically associated with a section of memory cells 225 in the bank section 223. The sense amplifiers may sense data values stored by memory cells of the sections and/or the sense amplifiers may sense residual voltages on the sense lines as a reference voltage for determination of a sensed data value.

In some embodiments, the sense amplifiers may at least temporarily store, e.g., cache, sensed data values. The compute components described herein in connection with the sense amplifiers may, in some embodiments, perform compute operations on the cached data values in the plurality of sensing component stripes 224.

As shown in FIG. 2, the bank section 223 can be associated with controller 240. The controller 240 shown in FIG. 2 can, in various embodiments, represent at least a portion of the functionality embodied by and contained in the controller 140 shown in and described in connection with FIG. 1. The controller 240 can direct, e.g., control, input of commands and data 239 to the bank section 223 and/or output, e.g., movement, of data from the bank section 223.

The bank section 223 can include a data bus, e.g., a 64 bit wide data bus which can correspond to the data bus 256. Each data bus for each bank of sections, e.g., 225-0, 225-1, . . . , 225-N-1, can be referred to as a portion of a data bus that contributes to formation of a combined data bus, e.g., for a plurality of banks and/or memory devices. As such, in some embodiments, eight 64 bit wide data bus portions for eight banks can contribute to a 512 bit wide combined data bus. However, embodiments are not limited to a particular data bus. Alternatively or in addition, each bank can individually use the entirety of the 512 bit wide combined data bus, although one bank at a time. Various combinations of using the data bus portions also may be utilized. For example, one bank may use four data bus portions at the same time as four other banks each use one of the remaining four data bus portions, among other possibilities.

In order to appreciate the performance of operations described herein, a discussion of an apparatus for implementing such techniques follows. For example, such an apparatus may be a memory device having a controller 240, that is on chip with a memory array (e.g. memory array 130 in FIG. 1) and/or sensing circuitry (e.g. sensing circuitry 150 in FIG. 1)

Figure 3:
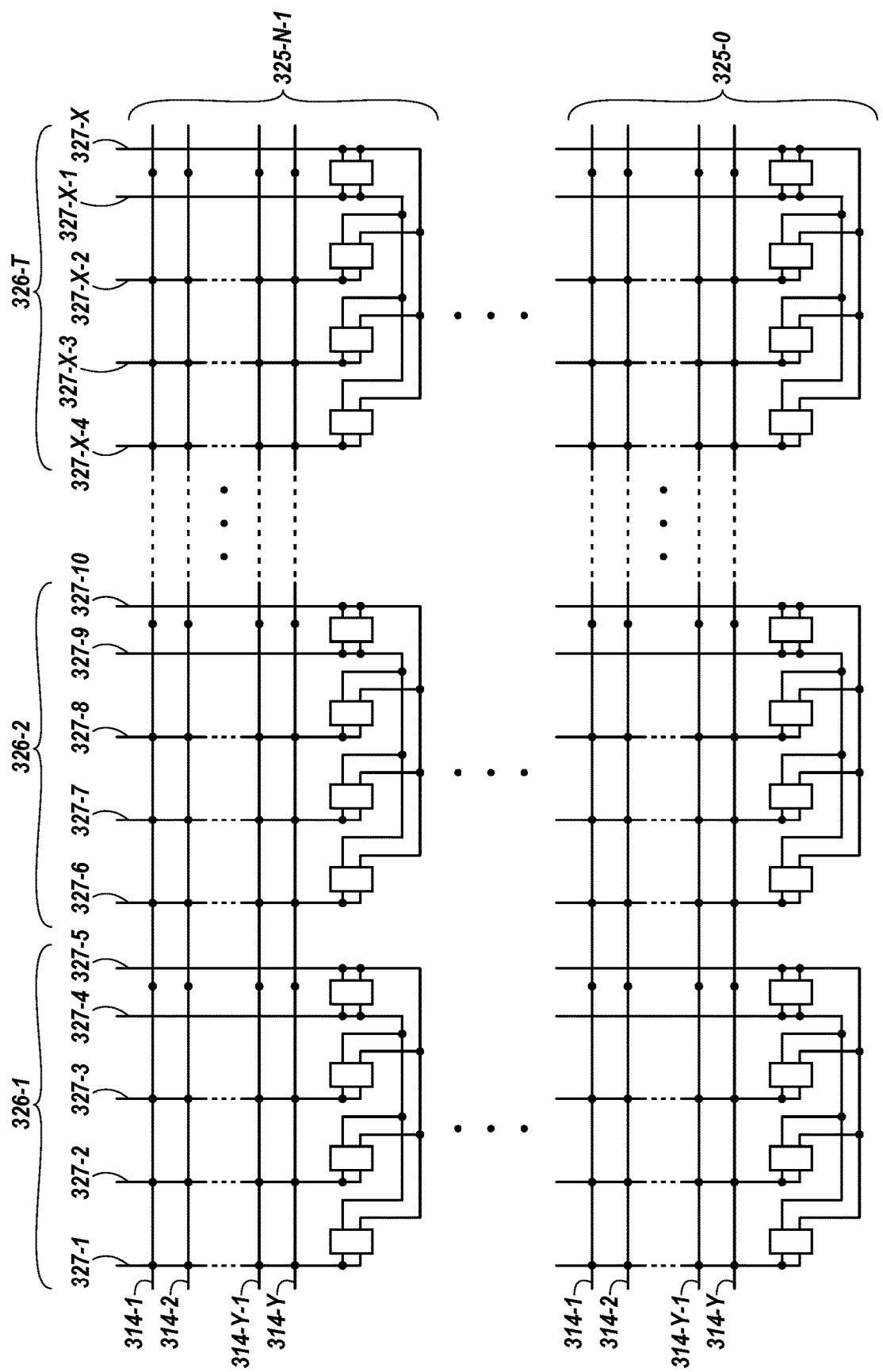
FIG. 3 is a schematic diagram illustrating sections and groups of memory cells in a bank of a memory device in accordance with a number of embodiments of the present disclosure.

FIG. 3 is a schematic diagram illustrating sections and groups of memory cells in a bank of a memory device in accordance with a number of embodiments of the present disclosure. FIG. 3 includes sections, e.g., section 0 at 325-0, section 1 at 325-1, section 2 at 325-2, section N-1 at 325-N-1 etc., in a bank of a memory device. Each of the sections includes memory cells coupled to Y rows of access lines 314-1, . . . , 314-Y and T columns 326-1, 326-2, . . . , 326-T of digit lines. Memory cells, indicated by dots in FIG. 3, are located at the intersections of the access lines 314-1, . . . , 314-Y and digit lines 327-1, . . . , 327-X. Each group of memory cells can include a number of one access device/one storage element memory cells (e.g., one transistor two capacitor (1T1C) memory cells) coupled to a first number of digit lines and a number of two access device/two storage element memory cells (e.g., two transistor two capacitor (2T2C) memory cells) coupled to two digit lines. Also, each group of memory cells can include a first number of one access device/one storage element memory cells coupled to a first number of digit lines and a second number of one access device/one storage element memory cells coupled to two digit lines, where the second number of one access device/one storage element memory cells are sensed together to obtain one bit of data.

In FIG. 3, group 326-1 includes one access device/one storage element memory cells coupled to three digit lines (e.g., digit lines 327-1, 327-2, and 327-3) and two access device/two storage element memory cells coupled to two 2 digit lines (e.g., digit lines 327-4 and 327-5). Groups of digit lines 326-1, . . . , 326-T are sensed using the voltage potential stored on the two access device/two storage element memory cells in the group (e.g. the memory cells coupled to digit lines 327-4 and 327-5 in group 326-1, digit lines 327-9 and 327-10 in group 326-2, and digit lines 327-X–1 and 327-X in group 326-T). Digit lines 327-1, 327-2, and 327-3 coupled to 1T1C memory cells can each be associated with a sense amp and digit lines 327-4 and 327-5 coupled to two access device/two storage element memory cells can be associated with a common sense amp. The one access device/one storage element memory cells can be sense based upon the voltage potential stored in the memory cell and the voltage potential stored in a two access device/two storage element memory cell on a common access line in the group of memory cells.

Figure 4:
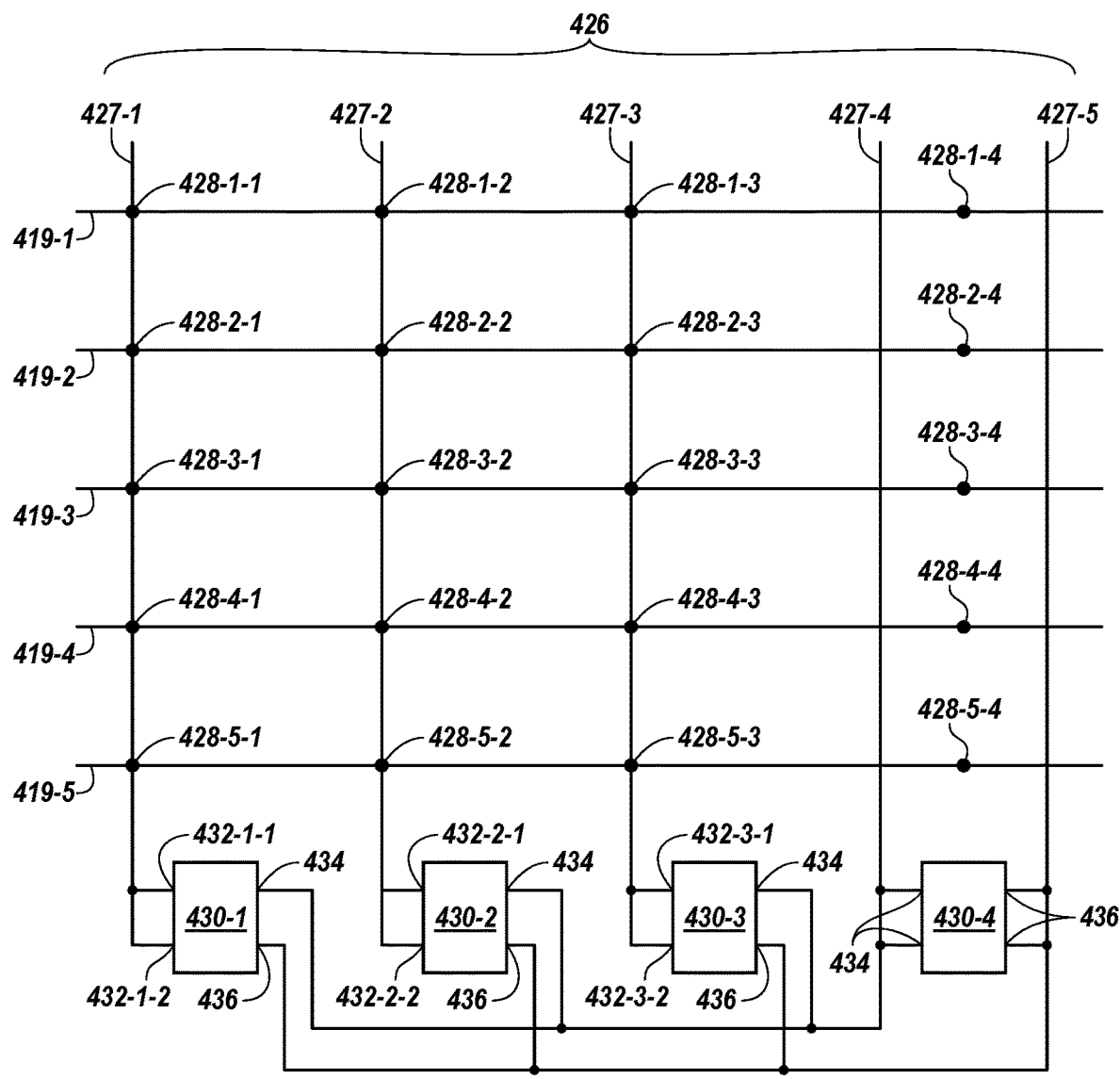
FIG. 4 is a schematic diagram illustrating a group of memory cells in accordance with a number of embodiments of the present disclosure.

FIG. 4 is a schematic diagram illustrating a group of memory cells in accordance with a number of embodiments of the present disclosure. In FIG. 4, group 426 of memory cells includes memory cells 428-1-1, . . . , 428-5-1 coupled to digit line 427-1 and respective access lines 419-1, . . . , 419-5, memory cells 428-1-2, . . . , 428-5-2 coupled to digit line 427-2 and respective access lines 419-1, . . . , 419-5, memory cells 428-1-3, . . . , 428-5-3 coupled to digit line 427-3 and respective access lines 419-1, . . . , 419-5. Memory cells 428-1-1, . . . , 428-5-1, memory cells 428-1-2, . . . , 428-5-2, and memory cells 428-1-3, . . . , 428-5-3 can be 1T1C memory cells. Group 426 of memory cells also includes memory cells 428-1-4, . . . , 428-5-4 coupled to digit lines 427-4 and 427-5 and respective access lines 419-1, . . . , 419-5. Memory cells 428-1-4, . . . , 428-5-4 can be 2T2C memory cells.

Memory cells 428-1-1, . . . , 428-5-1 coupled to digit line 427-1 are coupled to sense amp 430-1, memory cells 428-1-2, . . . , 428-5-2 coupled to digit line 427-2 are couple to sense amp 430-2, and memory cells 428-1-3, . . . , 428-5-3 coupled to digit line 427-3 are coupled to sense amp 430-3. Memory cells 428-1-4, . . . , 428-5-4 coupled to digit lines 427-4 and 427-5 are coupled each of the sense amps in group 426 (e.g., sense amps, 430-1, 430-2, 430-3 and 430-4).

Voltage potentials stored in the memory cells corresponding to a data state can be sensed by the sense amp to determine a data state of a memory cells. In a number of embodiments, a data state of a memory cell can be sensed by inputting a signal corresponding to the voltage potential stored in the memory cell into a sense amp. The signal corresponding to the voltage potential can be compared to voltage potentials of a two access device/two storage element memory cell that is coupled to the sense amp to determine the data state of the memory cell. For example, sensing memory cell 428-1-1 can include inputting a signal corresponding to the voltage potential stored memory cell 428-1-1 in input 432-1-1 of sense amp 430-1, inputting a signal corresponding to the voltage potential stored memory cell 428-1-1 in input 432-1-2 of sense amp 430-1, inputting a signal corresponding to the voltage potential stored on a first capacitor of memory cell 428-1-4 in input 434 of sense amp 430-1, and inputting a signal corresponding to the voltage potential stored on a second capacitor of memory cell 428-1-4 in input 436 of sense amp 430-1. Memory cell 428-1-4 is a two access device/two storage element memory cell that stores complementary voltage potentials (e.g., one capacitor stores a voltage potential corresponding to a first data state and the other capacitor stores a voltage potential corresponding to a second data state; or vice versa). Memory cell 428-1-4 can provide a reference voltage for sensing memory cell 428-1-1 in sense amp 430-1. Sense amp 430-1 can be configured to average inputs 434 and 436, which are inputs from complementary voltage potentials. The average of inputs 434 and 436 can be used as a reference voltage by sense amp 430-1 for determining a data state of memory cell 428-1-1. Inputs 432-1-1 and 432-2 are compared to inputs 434 and 436 in sense amp 430-1 to determine a data state of memory cells 428-1-1. If inputs 432-1-1 and 432-2 are less than an average of inputs 434 and 436, the memory cell is sensed to be at a first data state. If inputs 432-1-1 and 432-2 are greater than an average of inputs 434 and 436, the memory cell is sensed to be at second data state.

A data state of memory cell 428-1 is determined by inputting a signal corresponding to the voltage potential stored on a first capacitor of memory cell 428-1-4 in inputs 434 of sense amp 430-4 and inputting a signal corresponding to the voltage potential stored on a second capacitor of memory cell 428-1-4 in inputs 436 of sense amp 430-4. If inputs 434 are less than inputs 436, the memory cell is sensed to be at a first data state. If inputs 434 are greater than inputs 436, the memory cell is sensed to be at second data state.

Group 426 of memory cells can be configured to store and sense, on a given row of memory cells, 4 bits of data in memory cells that are coupled 5 digit lines. In a number of embodiments, groups of memory cells can be configured to store and sense, on a given row of memory cells, 1 less bit of data than the number of digit lines coupled to the memory cells in the group.

Figure 5:
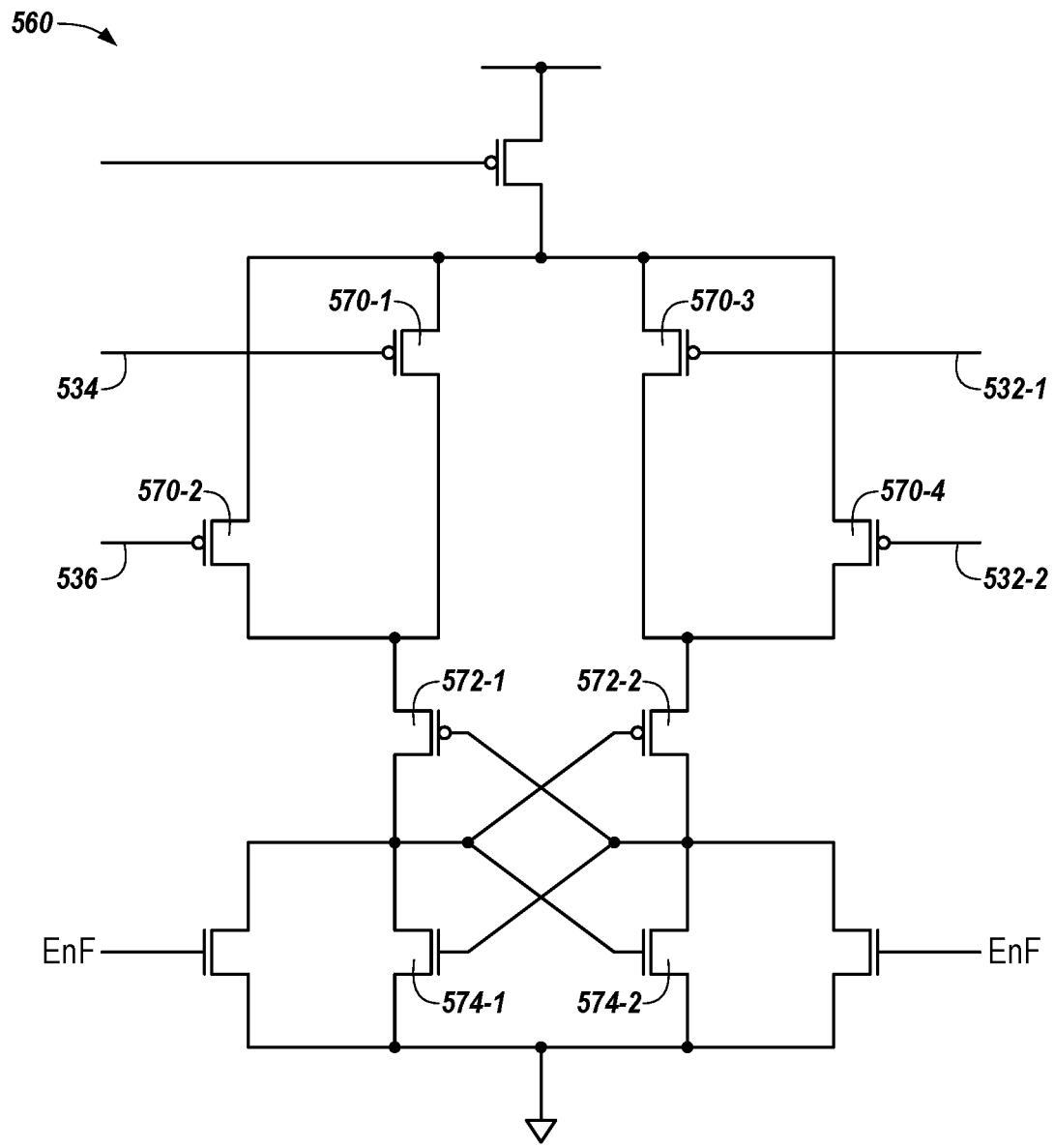
FIG. 5 illustrates a sense amp used to sense a memory cell in accordance with a number of embodiments of the present disclosure.

FIG. 5 illustrates a sense amp used to sense a memory cell in accordance with a number of embodiments of the present disclosure. In FIG. 5, sense amp 560 is configured to sense one access device/one storage element memory cells. Sense amp 560 can receive inputs 532-1 and 532-2 that correspond to a voltage potential stored on a one access device/one storage element memory cell. Input 532-1 is coupled to a gate of transistor 570-3 and input 532-2 is coupled to a gate of transistor 570-4. Sense amp 560 can receive complementary inputs from a two access device/two storage element memory cell that can be used as a reference for determining a data state of the memory cell. Sense amp 560 can receive input 534 that corresponds to a voltage potential stored on a first storage element of a two access device/two storage element memory cell and input 536 that corresponds to a voltage potential stored on a second storage element of a two access device/two storage element memory cell. Input 534 is coupled to a gate of transistor 570-1 and input 536 is coupled to a gate of transistor 570-2. A source drain region of transistors 570-1 and 570-2 is coupled to a first side of cross coupled latch and a source drain region of transistors 570-3 and 570-4 is coupled to a second side of a cross coupled latch. The cross coupled latch includes NMOS transistors 574-1 and 574-2 and PMOS transistors 572-1 and 572-2. Sense amp 560 can latch a signal that corresponds to a data value in response to inputs 532-1 and 532-2 from the memory cell being sensed and inputs 534 and 536 from a memory cell providing a reference signal.

Figure 6:
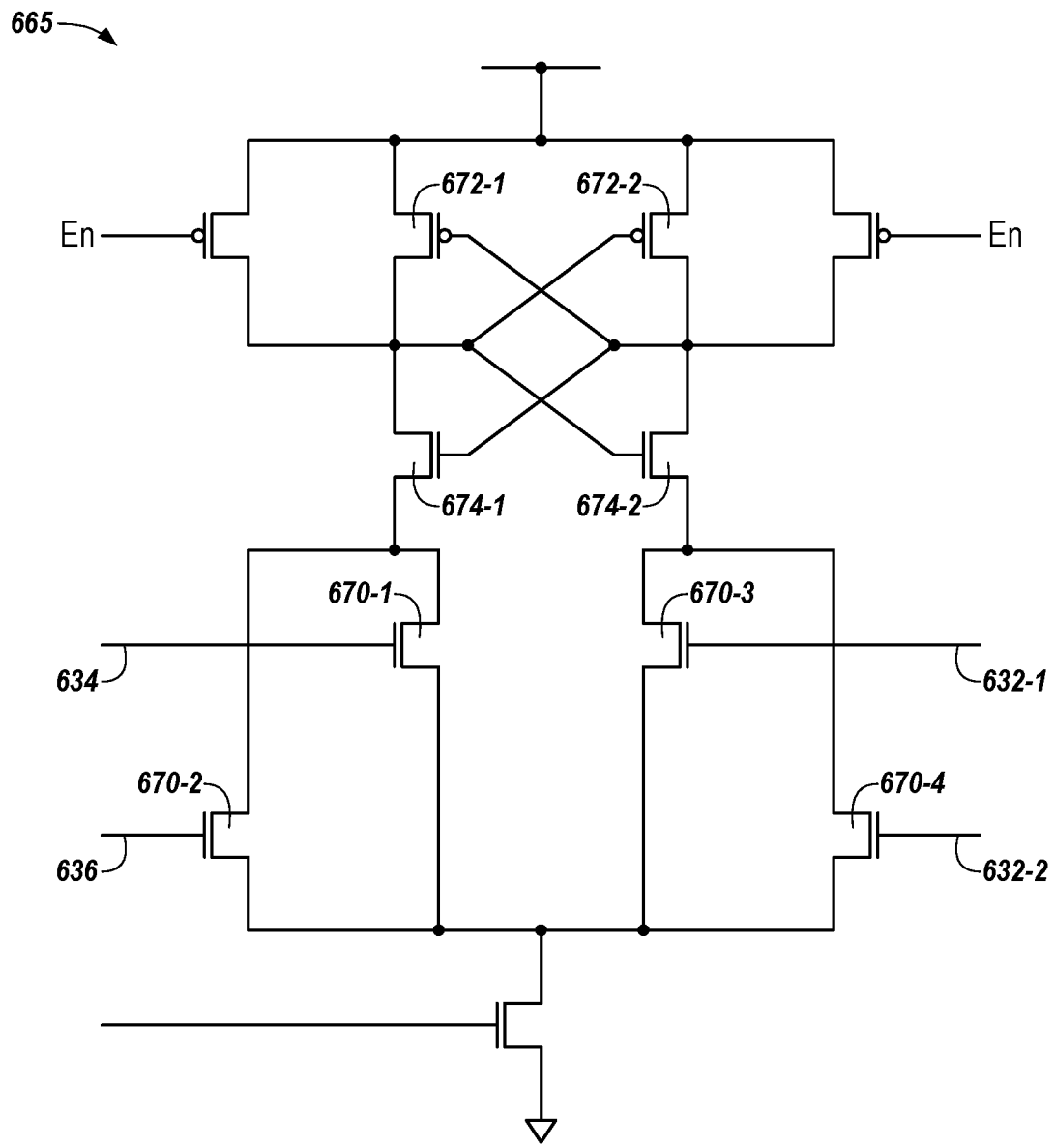
FIG. 6 illustrates a sense amp used to sense a memory cell in accordance with a number of embodiments of the present disclosure.

FIG. 6 illustrates a sense amp used to sense a memory cell in accordance with a number of embodiments of the present disclosure. In FIG. 6, sense amp 665 is configured to sense one access device/one storage element memory cell. Sense amp 665 can receive inputs 632-1 and 632-2 that correspond to a voltage potential stored on a one access device/one storage element memory cell. Input 632-1 is coupled to a gate of transistor 670-3 and input 632-2 is coupled to a gate of transistor 670-4. Sense amp 665 can receive complementary inputs from a two access device/two storage element memory cell that can be used as a reference for determining a data state of the memory cell. Sense amp 665 can receive input 634 that corresponds to a voltage potential stored on a first capacitor of a two access device/two storage element memory cell and input 636 that corresponds to a voltage potential stored on a second capacitor of a two access device/two storage element memory cell. Input 634 is coupled to a gate of transistor 670-1 and input 636 is coupled to a gate of transistor 670-2. A source drain region of transistors 670-1 and 670-2 is coupled to a first side of cross coupled latch and a source drain region of transistors 670-3 and 670-4 is coupled to a second side of a cross coupled latch. The cross coupled latch includes NMOS transistors 674-1 and 674-2 and PMOS transistors 672-1 and 672-2. Sense amp 665 can latch a signal that corresponds to a data value in response to inputs 632-1 and 632-2 from the memory cell being sensed and inputs 634 and 636 from a memory cell providing a reference signal.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   an array of memory cells; and
   a controller coupled to the array configured to:
      sense a first memory cell based upon a first input associated with the first memory cell and a second input and a third input associated with a second memory cell, wherein a data state of the first memory cell is sensed by comparing the first input to an average of the second and third inputs in a first sense amplifier associated with the first memory cell.

2. The apparatus of claim 1, wherein the second input corresponds to a first data state and the third input corresponds to a second data state and wherein the first and second data states are complementary.

3. The apparatus of claim 1, wherein the first memory cell and the second memory cell are coupled to a first sense amp associated with the first memory cell.

4. The apparatus of claim 1, wherein the second memory cell is coupled to a second sense amp associated with the second memory cell.

5. The apparatus of claim 1, wherein the first memory cell and the second memory cell are coupled to an access line.

6. An apparatus, comprising:
   an array of memory cells including a first memory cell coupled to a first sense amp, a second memory cell coupled to a second sense amp, and a third memory cell coupled to a third sense amp; and
   a controller configured to:
      sense the first memory cell by inputting a first signal associated with the first memory cell to the first sense amp and a second signal and a third signal associated with a fourth memory cell to the first sense amp, wherein an output of the first sense amp corresponding to a data state of the first memory cell is based a difference between the first signal and an average of the second and third signals.

7. The apparatus of claim 6, wherein the first sense amp includes a first input configured to receive the first signal, a second input configured to receive the first signal, third input configured to receive the second signal, and a fourth input configured to receive the third signal.

8. The apparatus of claim 6, wherein the second signal is a voltage that corresponds to first data state and third signal is a voltage that corresponds to a second data state.

9. The apparatus of claim 6, wherein the controller is configured to sense the second memory cell by inputting a fourth signal associated with the second memory cell to the second sense amp and the second and third signals associated with the fourth memory cell to the second sense amp.

10. The apparatus of claim 6, wherein the controller is configured to sense the third memory cell by inputting a fifth signal associated with the third memory cell to the third sense amp and the second and third signals associated with the fourth memory cell to the third sense amp.

11. A method, comprising:
   inputting a signal associated with a memory cell and complementary signals associated with another memory cell to a sense amp;
   sensing the memory cell at a first data state in response to the signal associated with the memory cell being greater than an average of the complementary signals; and
   sensing the memory cell at a second data state in response to the signal associated with the memory cell being less than an average of the complementary signals.

12. The method of claim 11, wherein sensing the memory cell at the first data state includes latching a signal in the sense amp that is greater than the average of the complementary signals.

13. The method of claim 11, wherein sensing the memory cell at the first data state includes latching a signal in the sense amp that is less than the average of the complementary signals.

14. The method of claim 11, further including programming the another memory cell with complementary signals that include a signal corresponding to the first data state and a signal corresponding to the second data state.

15. The method of claim 11, further including inputting the complementary signals associated with the another memory cell as a first signal and a second signal to another sense amp associated with the another sense amp.

16. The method of claim 15, further including sensing the another memory cell at a first data state in response to the first signal corresponding to the first data state and the second signal corresponding to the second data state.

17. The method of claim 16, further including sensing the another memory cell at a second data state in response to the first signal corresponding to the second data state and the second signal corresponding to the second data state.

18. An apparatus, comprising:
an array of memory cells including a first memory cell coupled to a first sense amp, a second memory cell coupled to a second sense amp, and a third memory cell coupled to a third sense amp; and
a controller configured to:
sense the first memory cell by inputting a first signal associated with the first memory cell to the first sense amp and a second signal and a third signal associated with a fourth memory cell to the first sense amp; and
sense the second memory cell by inputting a fourth signal associated with the second memory cell to the second sense amp and the second and third signals associated with the fourth memory cell to the second sense amp.

19. An apparatus, comprising:
an array of memory cells including a first memory cell coupled to a first sense amp, a second memory cell coupled to a second sense amp, and a third memory cell coupled to a third sense amp; and
a controller configured to:
sense the first memory cell by inputting a first signal associated with the first memory cell to the first sense amp and a second signal and a third signal associated with a fourth memory cell to the first sense amp; and
sense the third memory cell by inputting a fourth signal associated with the third memory cell to the third sense amp and the second and third signals associated with the fourth memory cell to the third sense amp.

* * * * *